(12) United States Patent
McAdams (10) Patent No.: US 8,476,951 B2
(45) Date of Patent: Jul. 2, 2013

(54) LATCH CIRCUIT WITH SINGLE NODE SINGLE-EVENT-UPSET IMMUNITY

(75) Inventor: Hugh Pryor McAdams, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 246 days.

(21) Appl. No.: 12/627,649

(22) Filed: Nov. 30, 2009

(65) Prior Publication Data
US 2010/0148837 A1 Jun. 17, 2010

Related U.S. Application Data

(60) Provisional application No. 61/121,824, filed on Dec. 11, 2008.

(51) Int. Cl.
*H03K 3/037* (2006.01)

(52) U.S. Cl.
USPC .............................................. 327/225; 326/46

(58) Field of Classification Search
USPC ................ 326/46, 93–98, 104, 112; 327/199, 327/201–203, 205, 208–212, 225
See application file for complete search history.

(56) References Cited

U.S. PATENT DOCUMENTS
4,877,974 A * 10/1989 Kawai et al. .................. 327/239

OTHER PUBLICATIONS

Wang et al., "Edge Triggered Pulse Latch Design with Delayed Latching Edge for Radiation Hardened Application", Trans. on Nuclear Science, vol. 51, No. 6 (IEEE, Dec. 2004), pp. 3626-3630.

* cited by examiner

*Primary Examiner* — Lincoln Donovan
*Assistant Examiner* — Diana J Cheng
(74) *Attorney, Agent, or Firm* — Rose Alyssa Keagy; Wade J. Brady, III; Frederick J. Telecky, Jr.

(57) ABSTRACT

A latch circuit, such as a memory cell or a flip-flop, that is immune to single-event upset at any single node. The latch circuit includes two banks of four logic gates each. The output of each logic gate in the first bank is connected to inputs of two logic gates in the second bank, and the output of each logic gate in the second bank is connected to inputs of two logic gates in the first bank. Each logic gate includes a logic function receiving an input node and an enable signal, such as a load signal. The interconnection of the logic gates corrects single-event upset at any one of the nodes. In the memory cell arrangement, redundant data paths are used to produce two input nodes provides single-event upset immunity at those input nodes. A layout of the latch circuit that ensures that random ionization affects only a single node is also disclosed.

23 Claims, 8 Drawing Sheets

LATCH CIRCUIT WITH SINGLE NODE SINGLE-EVENT-UPSET IMMUNITY

CROSS-REFERENCE TO RELATED APPLICATIONS

This application claims priority, under 35 U.S.C. §119(e), of Provisional Application No. 61/121,824, filed Dec. 11, 2008, incorporated herein by this reference.

STATEMENT REGARDING FEDERALLY SPONSORED RESEARCH OR DEVELOPMENT

Not applicable.

BACKGROUND OF THE INVENTION

This invention is in the field of electronic integrated circuits for storing data states. Embodiments of this invention are more specifically directed to memory and latch circuits with immunity to single-event-upsets (SEUs).

Advances in manufacturing technology have enabled the design and construction of electronic integrated circuits with ever-increasing capability and functionality, at ever-decreasing cost. These important advances have done so, in large part, by reducing the feature sizes of active and passive semiconductor devices (e.g., transistors, resistors, capacitors, interconnections). As a result, higher density integrated circuits that operate at faster switching rates can now be manufactured, yet at lower cost because more integrated circuits can be manufactured simultaneously on a single semiconductor wafer.

The extreme miniaturization of semiconductor devices has involved certain vulnerabilities in the reliability of integrated circuit operation, however. One such vulnerability is referred to in the art as "single event upset", or "SEU". An SEU is a change of state in an integrated circuit caused by ionic or electromagnetic radiation impacting sensitive nodes in the circuit. This radiation is commonly caused by cosmic particles ("cosmic rays") impacting atoms in close proximity to the integrated circuit, for example in the integrated circuit substrate, which releases free charge from ionization. An SEU occurs when this free charge is of a magnitude and polarity sufficient to change the state of a circuit node. An individual SEU typically has only a short-term effect on the operation of the circuit, as continued operation of the integrated circuit after the SEU will often cause the circuit to again reach a stable and correct operating state.

However, in integrated circuits deployed in inaccessible locations or providing critical "24/7" applications, an SEU can have longer-term effects with great consequences. For example, implantable medical devices such as cardiac pacemakers now have sophisticated computing circuitry, and remain in a powered-up state throughout their usable life. It is contemplated that, in some situations, an SEU causing a change in a stored data state in such a device could have long-lasting effect, requiring surgery to replace the upset device. In such applications, as well as in many other applications, it is desirable to design and construct the integrated circuits to be more tolerant of SEUs, so that stored data states or other steady-state conditions are not upset by SEUs of expected frequency and energy levels.

A typical conventional approach to improving the SEU stability of an integrated circuit is to intentionally provide collection capacitors at sensitive nodes in the integrated circuit. These collection capacitors, which may be separately constructed capacitors within the integrated circuit or simply intentionally increased parasitic capacitance at the sensitive circuit nodes, absorb the impinging free charge. This absorption allows the sensitive node to remain at its previous state or level, preventing the SEU. However, it has been observed, in connection with this invention, that the capacitance necessary to tolerate the amounts of charge that can cause an SEU is generally unknown, given the transient and variable nature of the causes of SEUs in practice. Especially as the miniaturization of transistors and passive devices continues, it has become impractical to use intentional capacitance to collect reasonable amounts of this transient charge.

BRIEF SUMMARY OF THE INVENTION

It is an object of embodiments of this invention to provide an integrated circuit in which stored or latched states can be retained despite a single-event-upset (SEU) at a sensitive node.

It is a further object of embodiments of this invention to provide such a circuit including memory cells that are SEU immune in this manner.

It is a further object of embodiments of this invention to provide such a circuit including logic latches, such as flip-flops, that are SEU immune in this manner.

It is a further object of embodiments of this invention to provide such a circuit that can be constructed according to the already-available manufacturing technology used to realize the remainder of the integrated circuit.

Other objects and advantages of embodiments of this invention will be apparent to those of ordinary skill in the art having reference to the following specification together with its drawings.

The present invention may be implemented into a latch circuit, such as a memory cell or flip-flop, constructed to include multiple logic gates arranged into redundant data paths. The logic gates have two or more inputs receiving the same logic values as one another, but that receive these logic values by way of differing combinations of the redundant data paths. In this manner, ionization charge of an amount typically causing an SEU that impacts a single node in the latch circuit cannot cause a permanent change in the latched state.

DETAILED DESCRIPTION OF THE INVENTION

The present invention will be described in connection with its various embodiments, namely as implemented into integrated circuits with embedded memory or logic functions, as it is contemplated that this invention will be particularly beneficial when used in such applications. However, it is also contemplated that other integrated circuit applications besides those described or mentioned in this specification will also benefit from this invention. Accordingly, it is to be understood that the following description is provided by way of example only, and is not intended to limit the true scope of this invention as claimed.

Figure 1:
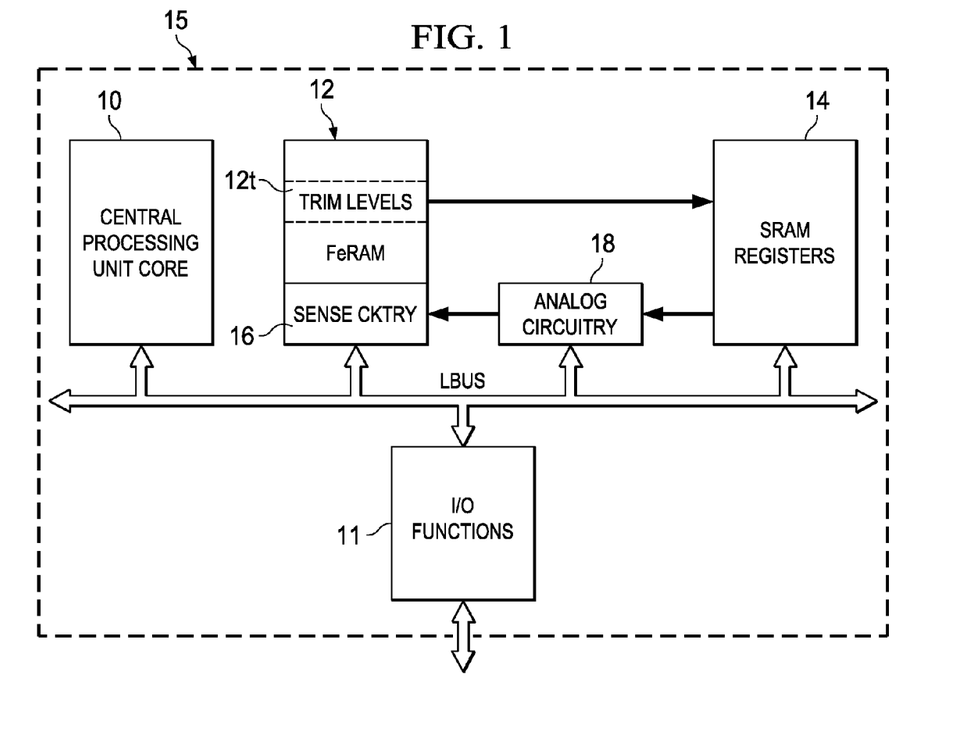
FIG. 1 is an electrical diagram, in block form, of an integrated circuit including a memory constructed according to embodiments of the invention.

FIG. 1 illustrates an example of a large-scale integrated circuit in which an embodiment of the invention is realized. In this example, integrated circuit 15 includes functional circuitry in combination with embedded ferroelectric random access memory (FeRAM) 12, formed in a single integrated circuit die or chip. In this example of FIG. 1, the functional circuitry constitutes central processing unit (CPU) core 10, which may be a conventional microprocessor or digital signal processor core as known in the art. Integrated circuit 15 includes such other functions as typical for a large-scale programmable processor, such as input/output functions 11, which are in communication with CPU core 10 via local bus LBUS. FeRAM 12 also communicates with CPU core 10 via local bus LBUS; a memory manager circuit (not shown) is often included to control the access of various memory resources within integrated circuit 15 beyond those shown in FIG. 1. Other circuit functions (not shown) as clock circuits, timers, power management circuits, special functionality, control circuits such as direct memory access controllers, and the like are also typically included within large scale integrated circuits such as integrated circuit 15.

FeRAM 12, as embedded within integrated circuit 15 as shown in FIG. 1, is realized in the conventional manner by a number of ferroelectric memory cells, such as of the one-transistor one-capacitor (1-T, 1-C) type, arranged in rows and columns. Access to the desired memory cells within FeRAM 12 is made by way of conventional address decoders, control logic, and the necessary word line and bit line conductors (not shown) within FeRAM 12. As known in the art, address decoders respond to address signals communicated to FeRAM 12 over local bus LBUS, for example from CPU core 10, to energize one or more selected word lines that place all or part of a row of memory cells in communication with selected bit lines also indicated by the address signals. In write cycles, drive circuitry establishes the data states to be written into the addressed ferroelectric memory cells by applying the appropriate polarization voltages. In read cycles, the data states of the addressed memory cells are sensed by sense circuitry 16. In this example, sense circuitry 16 compares a voltage established by the amount of charge stored in each addressed memory cell to a reference level, and outputs a logic level corresponding to the result of that comparison.

Analog functional circuitry 18 is also provided in integrated circuit 15, and includes any one or more of a number of analog functions, such as signal level conversion, bandgap reference voltage generation, reference current generation, voltage regulation, analog input/output functions, and the like. In this example, one function of analog functional circuitry 18 is to define the sense reference level used by sense circuitry 16 to discern stored data states in addressed memory cells of FeRAM 12. The proper sense level is selected and applied by analog functional circuitry 18 in this example, based on the contents of one or more of static random access memory (SRAM) registers 14, such contents used to programmably set or "trim" the reference voltage and current levels established or used by analog functional circuitry 18. The contents of SRAM registers 14 are, of course, volatile in the sense that these contents are lost upon power-down of integrated circuit 15.

SRAM registers 14 in this example of integrated circuit 15 provide a number of register locations that are readily accessed by way of local bus LBUS, into which contents can be stored from local bus LBUS or read via local bus LBUS. As mentioned above, SRAM registers 14 include one or more registers that trim the reference level used by sense circuitry 16; of course, SRAM registers 14 will typically store other specific control information etc. used by integrated circuit 15 in its operation.

In many important applications of integrated circuit 15, for example in implantable medical devices, the contents of one or more registers within SRAM registers 14 are loaded with the contents of specific memory locations within FeRAM 12 on power up, either via local bus LBUS or by a direct path as suggested in FIG. 1. One such example of this operation is illustrated in FIG. 1, with respect to non-volatile FeRAM portion 12t, which stores one or more trim levels to be used by analog circuitry 18, including the particular trim levels to be used by sense circuitry 16 of FeRAM 12 itself. These trim levels for various analog functions, such as the sense reference level used by sense circuitry 16 of FeRAM 12, can be and often are determined during manufacturing test, and then stored in FeRAM portion 12t so as to remain available throughout the life of integrated circuit 15. In the example of FIG. 1, the contents of FeRAM portion 12t containing these trim levels are written into one or more of SRAM registers 14 during the power-on sequence of integrated circuit 15. Because SRAM registers 14 respond faster to read requests than does FeRAM 12, the loading of SRAM registers 14 with these trim levels from FeRAM portion 12 allows these and other parameters to be rapidly accessed during operation, while still obtaining the benefit of non-volatile storage of those values.

In some applications, however, this loading of parameters into SRAM registers 14 on power-up creates a vulnerability. One example of such vulnerability is present in those applications in which the integrated circuit is initially powered-up and then remains powered up constantly over its useful life, such as in the case of in implantable medical devices. In that case, the integrated circuit will be powered up once and only once, so that the contents written into the SRAM registers on power-up will not be rewritten throughout the useful life of the device. However, if a single-event-upset (SEU) upsets a data state stored in those SRAM registers, there is no opportunity for the correct data states to be stored in the SRAM registers again, because power-down and power-up will not necessarily occur in the normal use of that device. As a result, in this situation, the disturbed, incorrect, data state then present in the SRAM registers after the SEU disturbance will remain in place. In the worst case, the integrated circuit may cease to function altogether (e.g., if the sense reference level then present in the SRAM registers cannot discern between "1" and "0" states stored in the FeRAM memory cells), requiring surgery to replace the implanted medical device.

According to embodiments of this invention, this vulnerability is addressed and avoided because of the construction of memory cells in SRAM registers 14, such construction specifically directed to render the stored data states immune to SEUs at any given single node. More particularly, these embodiments of the invention provide this single node SEU immunity without relying on collection capacitances, which as mentioned above, cannot be efficiently sized to provide adequate immunity, particularly considering the small feature sizes made available by modern manufacturing technology.

Figure 2A:
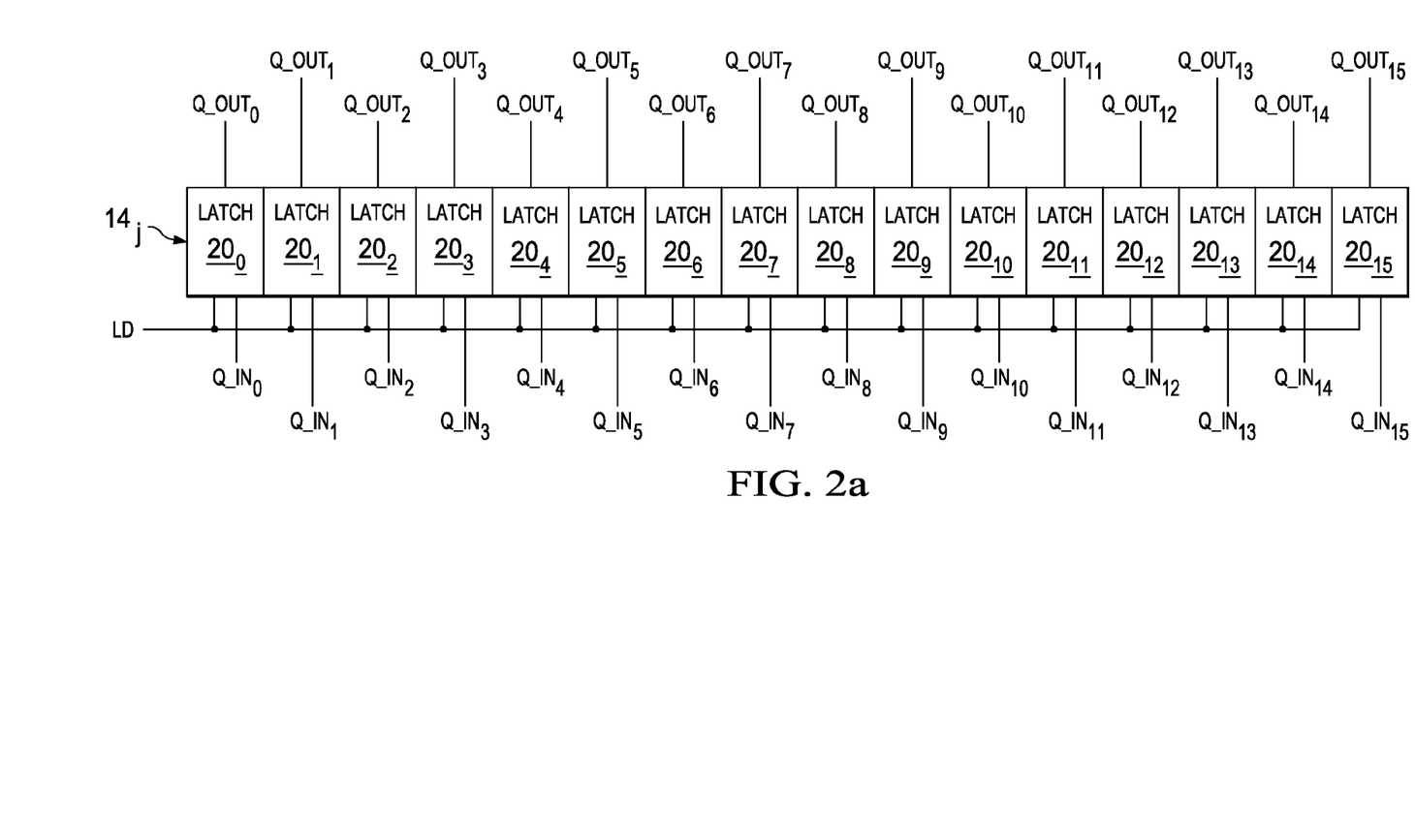
FIG. 2a is an electrical diagram, in block form, of a register location within the integrated circuit of FIG. 1 according to embodiments of the invention.

FIG. 2a illustrates an example of register $14_j$ as one of SRAM registers 14 of integrated circuit 15 shown in FIG. 1, to provide context for some embodiments of the invention. Register $14_j$ is a sixteen-bit register in this example, constructed by way of sixteen latches $20_0$ through $20_{15}$; of course, the size or width of register $14_j$ can vary from that shown in FIG. 2a, depending on the architecture and construction of SRAM registers 14. In this example, register $14_j$ is a static register, in that its contents are available without requiring clocking or other dynamic operation; peripheral circuitry for selecting register $14_j$ from among others of SRAM registers 14 in response to control signals or other commands will also be present, but is not shown for the sake of clarity. As shown in FIG. 2a, each latch $20_k$ of register $14_j$ receives an input data line Q_IN$_k$, the digital level of which that latch $20_k$ stores upon receiving load enable signal LD; each latch $20_k$ statically presents its contents on output data line Q_OUT$_k$. Of course, register $14_j$ may be constructed and operated according to other known construction approaches for SRAM registers, as the arrangement of FIG. 2a is presented by way of example simply to provide context for the description of embodiments of this invention.

Figure 2B:
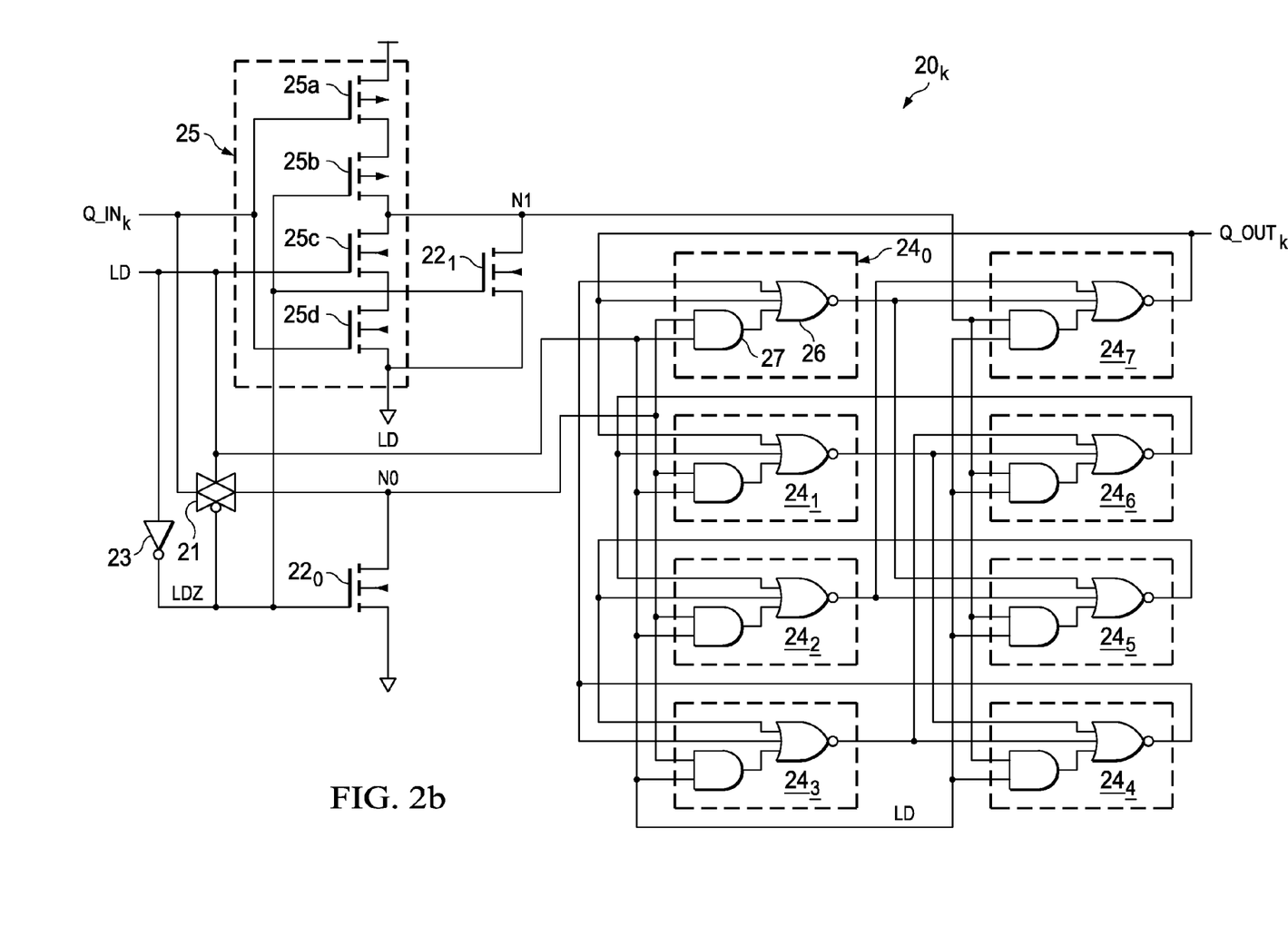
FIG. 2b is an electrical diagram, in schematic form, of a memory cell circuit constructed according to an embodiment of the invention.

FIG. 2b illustrates the construction of latch $20_k$ in register $14_j$ of FIG. 2a, according to an embodiment of this invention. As evident from FIG. 2b, latch $20_k$ in this example is constructed by way of complementary metal-oxide-semiconductor (CMOS) technology, including p-channel and n-channel MOS transistors. Of course, latch $20_k$ may be constructed by way of PMOS or NMOS devices only, bipolar devices (in combination with MOS transistors or not), or by way of such other devices available in the manufacturing technology used to construct integrated circuit 15.

In this example, data input line Q_IN$_k$ is applied to two separate input data paths within latch $20_k$. One of these data paths includes pass gate 21, which receives load enable signal LD and its complement LDZ (generated from load enable signal LD by inverter 23, which may be within latch $20_k$ as shown or provided separately from outside of register $14_j$) at its control inputs. The output of pass gate 21 at node N0 is connected to pull-down device $22_0$, which has its source/drain path coupled between node N0 and ground, and receives signal LDZ at its gate. Pull-down device $22_0$ discharges node N0 to ground when load enable signal LD is inactive low (i.e., when signal LDZ is at a high level).

The redundant data path of the input data state presented on data input line Q_IN$_k$ passes through logic gate 25, the output of which drives node N1. Logic gate 25 effectively performs the logical AND of the inverse of data input line Q_IN$_k$ and load enable signal LD. In the CMOS arrangement shown in FIG. 2b, logic gate includes a pair of p-channel transistors 25a, 25b and a pair of n-channel transistors 25c, 25d, series-connected so that the source/drain paths of p-channel transistors 25a and 25b are connected in series between $V_{dd}$ and output node N1, and the source/drain paths of n-channel transistors 25c and 25d are connected in series between output node N1 and ground. The gates of p-channel transistor 25a and n-channel transistor 25d receive input data line Q_IN$_k$, the gate of p-channel transistor 25b receives load enable signal LD, and the gate of n-channel transistor 25c receives complementary load enable signal LDZ. Accordingly, with load enable signal LD active at a high level, node N1 presents the logical complement of the state at input data line Q_IN$_k$. Pull-down device $22_1$ has its source/drain path connected between node N1 and ground and its gate receiving complementary load enable signal LDZ, to discharge node N1 to ground when signal LDZ is inactive high.

The redundant copies (complementary copies, in this example) of the input data state on line Q_IN$_k$ that are presented at nodes N0, N1 while load enable signal LD is active high are applied to respective banks of interlocked logic gates 24 in latch $20_k$, according to this embodiment of the invention. In this example, one bank of logic gates 24 consists of logic gates $24_0$, $24_1$, $24_2$, $24_3$, and the other bank of logic gates 24 consists of logic gates $24_4$, $24_5$, $24_6$, $24_7$. Each logic gate 24 in this example includes three-input NOR gate 26 and two-input AND gate 27, where one input of NOR gate 26 receives the output of AND gate 27. In this example, each of logic gates $24_0$, $24_1$, $24_2$, $24_3$ receives the state of node N0 at one of the inputs to its AND gates 27, and each of logic gates $24_4$, $24_5$, $24_6$, $24_7$ receives the state of node N1 at one of the inputs to its AND gates 27. The second input to AND gate 27 in each of the eight logic gates 24 of latch $20_k$ receives load enable signal LD. While logic gates 24 are described above and illustrated as two separate gates of NOR gate 26 and AND gate 27, those skilled in the art having reference to this specification will recognize that logic gates 24 may be realized as a single complex logic gate circuit implementing the combination of the AND and NOR logic functions.

The two remaining inputs to NOR gate 26 in each of the eight logic gates 24 in latch $20_k$ receives outputs from others of logic gates 24, routed in an interlocking fashion. More specifically, according to this embodiment of the invention, the two inputs to NOR gate 26 in a given logic gate 24 in one of the banks receive outputs from a pair of logic gates 24 in the opposite bank. For example, one input of NOR gate 26 in logic gate $24_0$ receives the output of logic gate $24_4$, and a second input of NOR gate 26 in logic gate $24_0$ receives the output of logic gate $24_7$; both of logic gates $24_4$ and $24_7$ are in the opposite bank from logic gate $24_0$. The interlocking feedback arrangement of logic gates 24 in latch $20_k$ according to this invention is summarized in this table:

| Logic gate | One NOR input receives the output of: | Another NOR input receives the output of: | Its AND input receives data node: |
|---|---|---|---|
| $24_0$ | $24_7$ | $24_4$ | N0 |
| $24_1$ | $24_6$ | $24_7$ | N0 |
| $24_2$ | $24_5$ | $24_6$ | N0 |
| $24_3$ | $24_5$ | $24_4$ | N0 |
| $24_4$ | $24_1$ | $24_3$ | N1 |
| $24_5$ | $24_0$ | $24_2$ | N1 |
| $24_6$ | $24_3$ | $24_1$ | N1 |
| $24_7$ | $24_2$ | $24_0$ | N1 |

In general, the output of each logic gate 24 in one bank is presented to inputs of NOR gate 26 in two logic gates 24 in the other bank, and inputs of NOR gate 26 in each logic gate 24 in a given bank receive outputs from two separate logic gates 24 in the other bank. In this example, the output of logic gate $24_7$ presents output data line Q_OUT$_k$; of course, any one of logic gates $24_0$ through $24_7$ could be used to drive the output data state. Further buffering of the output of latch $20_k$ may be provided as desired.

In operation, prior to an active high logic level of load enable signal LD, latch $20_k$ retains its prior data state because the low logic level of signal LD forces the output of all AND gates 27 in logic gates 24 to a low logic level; in this condition, the state at the output of each logic gate 24 is determined by the other two inputs to its NOR gate 26, those inputs driven by the outputs of other logic gates 24 in the opposite bank. Also in this non-load state with signal LD at a low level, nodes N0, N1 are discharged to ground by the operation of transistors $22_0$, $22_1$. Upon receiving an active high level of load enable signal LD, latch $20_k$ propagates the logic level of input data line Q_IN$_k$ to complementary nodes N0, N1, and from these nodes through logic gates 24 to output data line Q_OUT$_k$.

Consider the example in which input data line Q_IN$_k$ is at a high logic level ("1") at the time load enable signal LD transitions to an active high level. In this case, the high logic level on line Q_IN$_k$ will propagate as a "1" to node N0, and will be inverted by logic gate 25 to appear as a low level ("0") at node N1. The "1" at node N0, in combination with the high logic level of signal LD, will force a "1" at the output of each of AND gates 27 in the first bank of logic gates 24 (i.e., logic gates $24_0$ through $24_3$). The outputs of logic gates $24_0$, $24_1$, $24_2$, $24_3$ thus are all forced to a "0", regardless of the state of the feedback signals at the other two inputs to NOR gates 26 in these logic gates 24 in the first bank.

Because node N1 is at a "0" at this time, the output of each AND gate 27 in the second bank of logic gates $24_4$, $24_5$, $24_6$, $24_7$ is "0". In addition, because the other two inputs to NOR gates 26 of logic gates $24_4$, $24_5$, $24_6$, $24_7$ receive only outputs from logic gates $24_0$, $24_1$, $24_2$, $24_3$, all of which are now at "0" levels, the outputs of the NOR gates 26 in logic gates $24_4$, $24_5$, $24_6$, $24_7$ are all forced to a "1" level. Output data line Q_OUT$_k$ is thus also at a "1" level, matching the level of input data line Q_IN$_k$. The "1" levels at the outputs of logic gates $24_4$, $24_5$, $24_6$, $24_7$ are fed back to the inputs of NOR gates 26 of logic gates $24_0$, $24_1$, $24_2$, $24_3$, forcing "0" levels at their outputs even after load enable signal LD returns low. These "0" levels are fed back to the inputs of NOR gates 26 in logic gates $24_4$, $24_5$, $24_6$, $24_7$, ensuring "1" levels at their outputs after load enable signal LD returns low (which forces the outputs of AND gates 27 in logic gates $24_4$, $24_5$, $24_6$, $24_7$ to "0"). The "1" data state thus is latched into latch $20_k$.

Those skilled in the art having reference to this specification can similarly track the operation of latch $20_k$ in response to the loading of a "0" data state. In that event, to summarize, node N0 is at a "0" level and node N1 is at a "1" level. In response to the "0" level at input data line Q_IN$_k$, logic gates $24_0$, $24_1$, $24_2$, $24_3$ drive "1" levels at their outputs, which causes "0" levels at the outputs of logic gates $24_4$, $24_5$, $24_6$, $24_7$ and thus on output data line Q_OUT$_k$. The feedback arrangement of logic gates 24 within latch $20_k$ maintain this condition after load enable signal LD returns to an inactive low level.

According to this embodiment of the invention, latch $20_k$ is immune to permanent upset of its data state upon any single node being disturbed by a single-event-upset (SEU). For example, if a SEU causes node N0 to change state from a "0" to a "1" logic level, during which time node N1 will be at a "0" logic level (and undisturbed by the SEU), the states of logic gates $24_0$, $24_1$, $24_2$, $24_3$ will not change state in response to the erroneous logic level at node N0 because load enable signal LD is inactive low, and thus prevents propagation of the erroneous "1" through AND gates 27 in logic gates 24. Similarly, an SEU disturbance of the logic state of node N1 will not cause an erroneous state to be latched into latch $20_k$.

In addition, an SEU event at any single one of the output nodes of logic gates 24 will not cause latch $20_k$ to erroneously change state. Consider the example of logic gates $24_0$, $24_1$, $24_2$, $24_3$ each driving a "1" level at their outputs with the outputs of logic gates $24_4$, $24_5$, $24_6$, $24_7$ initially at a "0" level. An SEU event that disturbs the output of logic gate $24_7$ to a "1" level will also cause the outputs of logic gates $24_0$ and $24_1$ to change state to a "0" level, because the erroneous "1" level at the output of logic gate $24_7$ is applied to an input of NOR gate 26 in logic gates $24_0$ and $24_1$. But this condition is promptly corrected because the "1" levels remaining at the outputs of logic gates $24_2$ and $24_3$ prevent regenerative reinforcement of the "1" state on the output of logic gate $24_7$, and prevent a change of state in logic gate $24_5$. Likewise, the "1" level at the output of logic gate $24_3$ prevents a change in the state of logic gates $24_4$ and $24_6$. And because the output of logic gate $24_2$ remains at a "1" logic level, then the output of logic gate $24_7$ will return to its correct "0" level after the SEU, even though the outputs of logic gates $24_0$ and $24_1$ temporarily changed state during the SEU.

Figure 3A:
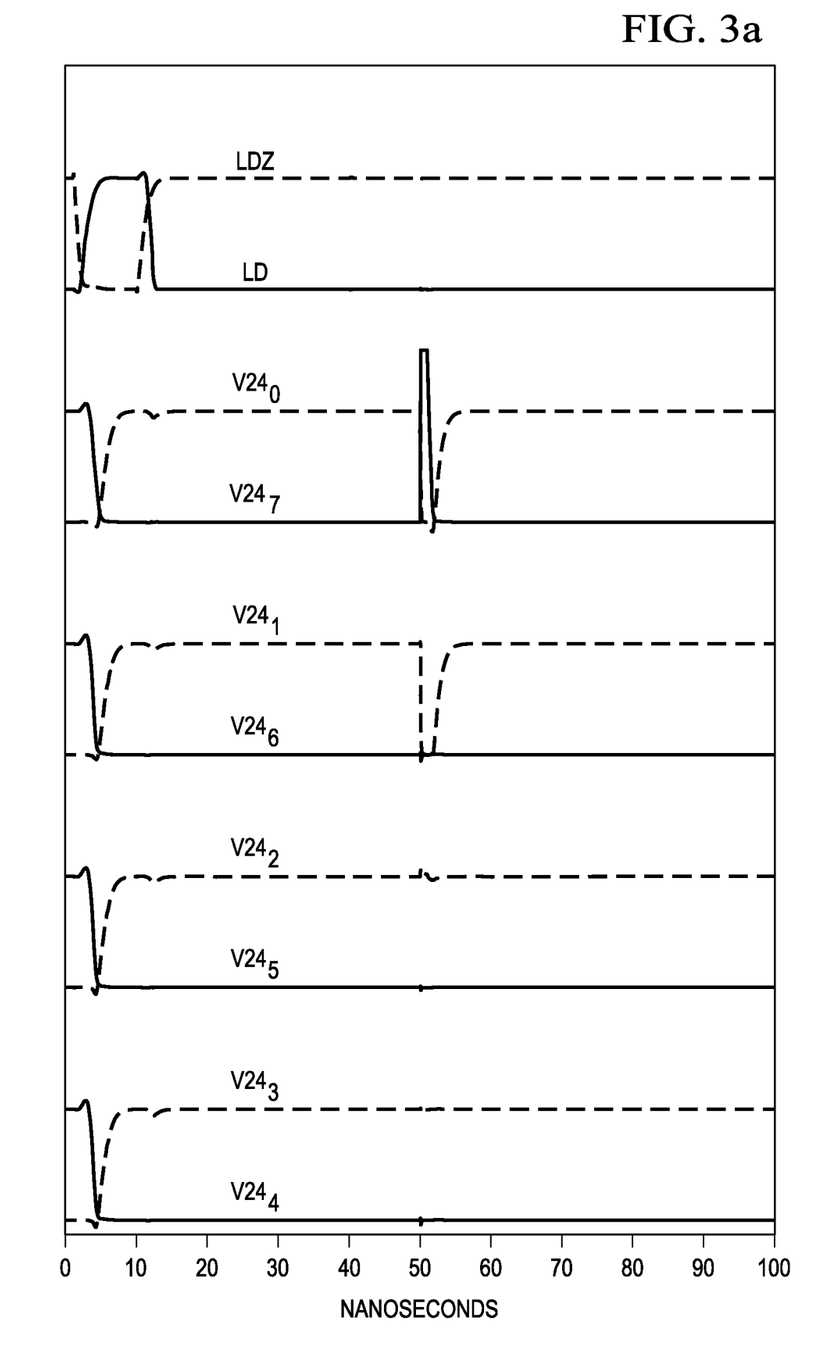
FIGS. 3a and 3b are timing diagrams illustrating the operation of the memory cell circuit of FIG. 2 in tolerating a single-node SEU.

This operation of latch $20_k$ in response to this example of an SEU event at the output of logic gate $24_7$ is illustrated by way of the timing diagram of FIG. 3a, which was generated by way of circuit simulation. The SEU event is simulated by the application of 150 pC of positive charge to the output of logic gate $24_7$ at time t=50 nsec; voltage V$24_7$ represents the effect of this charge at that time, by way of the high voltage spike from its previous low logic level. As evident in FIG. 3a, and as described above, voltage V$24_0$ at the output of logic gate $24_0$ and voltage V$24_1$ at the output of logic gate $24_1$ make an excursion from a "1" logic level to a "0" logic level at that time. But the voltages at the outputs of other logic gates $24_3$ through $24_6$ (represented by voltages V$24_3$ through V$24_6$, respectively) show at most a slight ripple effect at time t=50 nsec due to loading effects from the SEU excursion, but this ripple is insufficient to result in a change of logic state. As a result, the excursions of voltages V$24_0$ and V$24_1$ in response to the SEU are only of a brief duration, on the order of the duration of the SEU pulse itself, following which these voltages V$24_0$ and V$24_1$ return to their proper "1" levels as before the SEU.

Figure 3B:
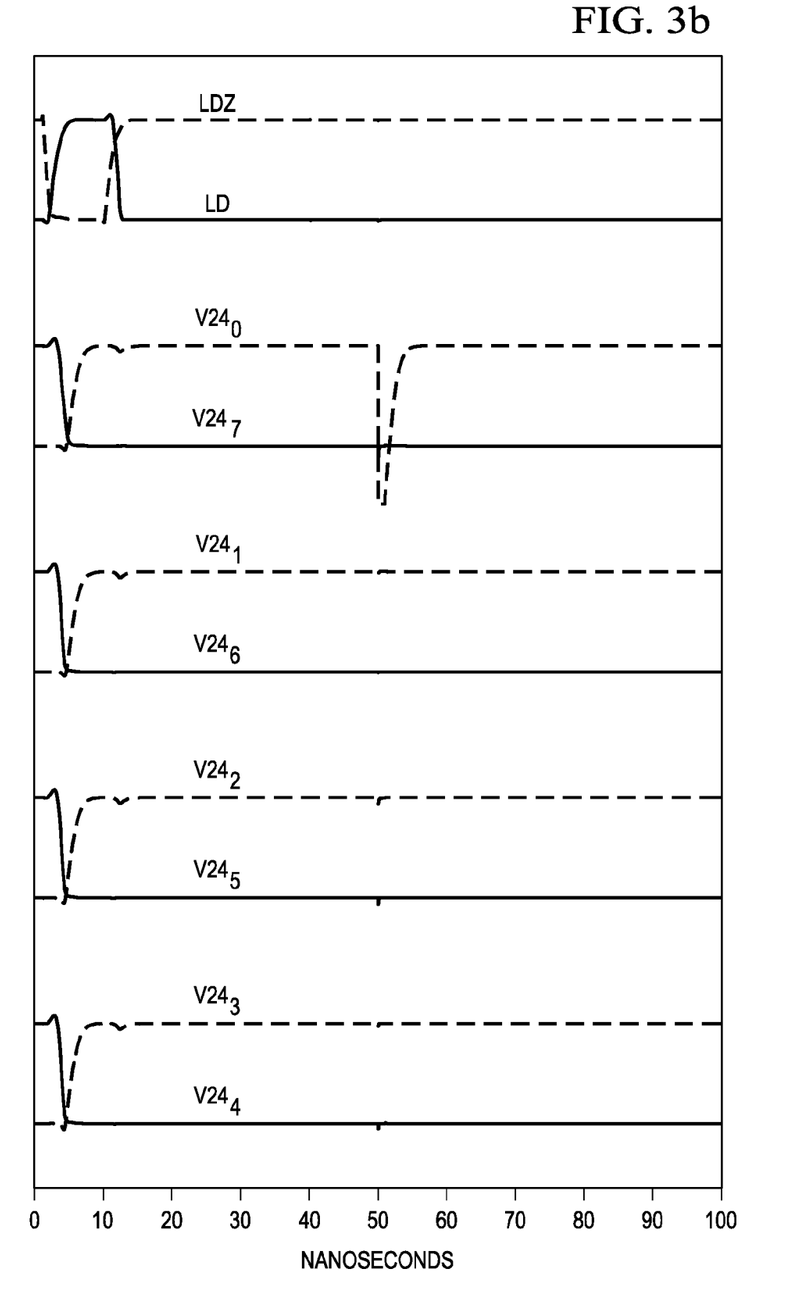

FIG. 3b illustrates the operation of latch $20_k$ in response to an SEU disturbance causing voltage V$24_0$ at the output of logic gate $24_0$ to make an excursion from a "1" level to a "0" level. As in FIG. 3a, the timing diagram of FIG. 3b is based on circuit simulation of the application of 150 pC of charge, at time t=50 nsec. This disturbance from a "1" level to a "0" level has even less effect than the disturbance of opposite polarity described above relative to FIG. 3a. Specifically, the "0" level at the output of logic gate $24_0$ does not cause a change in state at the output of any other logic gates 24 in latch $20_k$. Logic gates $24_5$ and $24_7$ are the only logic gates 24 receiving the output of logic gate $24_0$ at an input, and these logic gates $24_5$ and $24_7$ are receiving "1" levels at inputs of their NOR gates 26 from other (undisturbed) nodes in latch $20_k$. As such, the outputs of logic gates $24_5$ and $24_7$ remain at a "0" level despite the SEU excursion at the output of logic gate $24_0$. At most, slight ripples are evident at some of the nodes (e.g., voltage V$24_2$) due to the loading effect by NOR gates 26 of logic gates $24_5$ and $24_7$ in response to the SEU excursion. As a result, latch $20_k$ is immune to the SEU excursion of negative polarity at nodes driven by its logic gates 24.

Those skilled in the art having reference to this specification will recognize that SEU disturbances at any of the other outputs of logic gates 24 will similarly be brief and self-correcting, because of the interlocking feedback paths of logic gates 24 in this embodiment of the invention. Accordingly, latch $20_k$ is effectively immune to SEUs occurring at any single node, including nodes N0 and N1, as well as the outputs of its logic gates 24.

Figure 4:
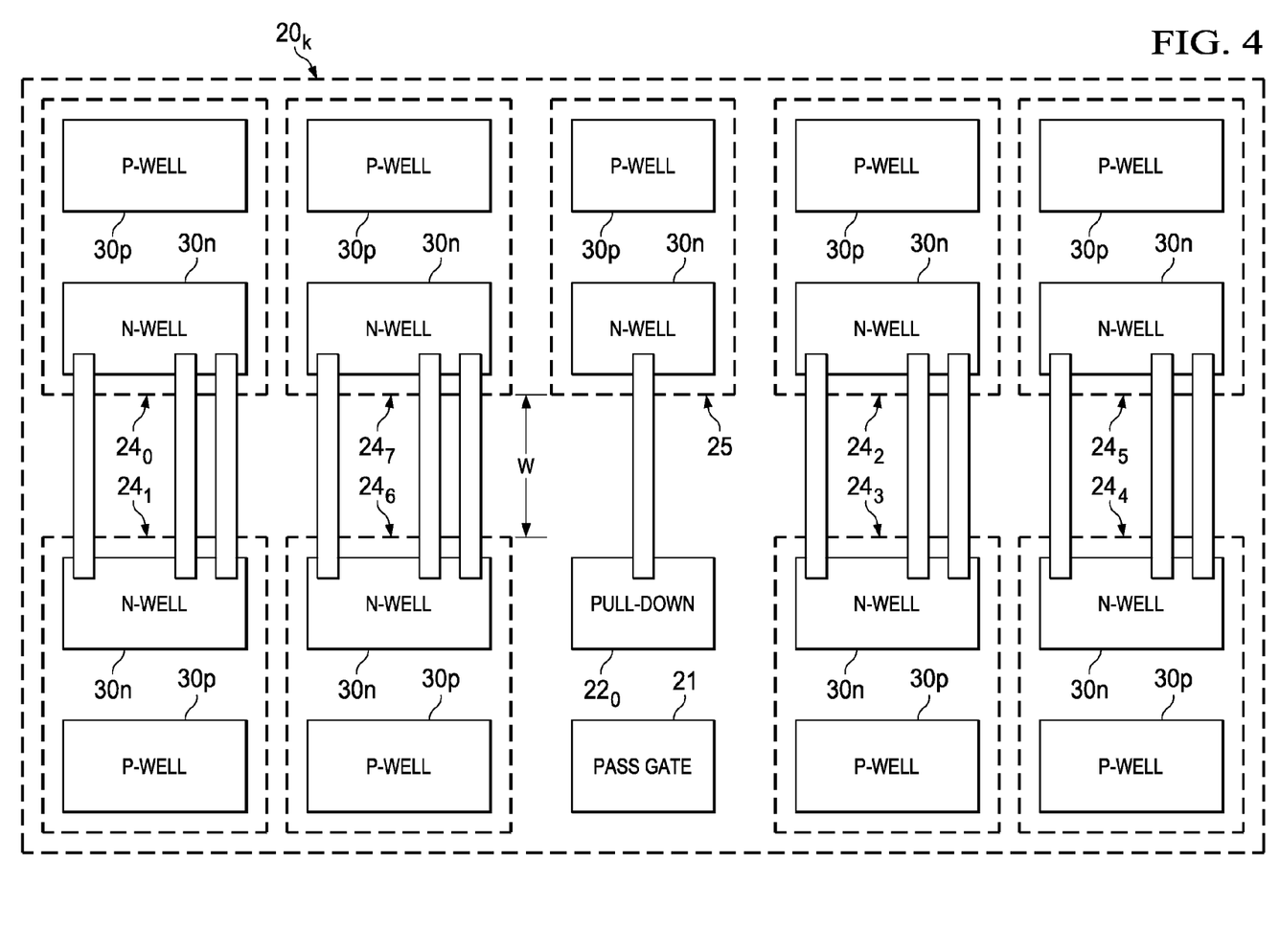
FIG. 4 is a plan view of the layout of a portion of an integrated circuit into which the memory cell circuit is realized according to an embodiment of the invention.

It is, of course, useful to ensure that any SEU expected to be encountered by integrated circuit 15 in fact affects at most a single node within each latch $20_k$. According to an aspect of this invention, the manner in which latch $20_k$ is laid out at the surface of the semiconductor body realizing integrated circuit 15 ensures that such is the case. FIG. 4 illustrates an example of a layout of latch $20_k$ in which the likelihood of an SEU affecting multiple nodes is minimized. The plan view of FIG. 4 illustrates the general placement of devices in the schematic diagram of FIG. 2b, but for the sake of clarity does not show the individual transistors or other components, nor all interconnections, nor the power and ground plane conductors. It is contemplated that those skilled in the art having reference to this specification will be readily able to implement the specific transistors and conductors, etc., as appropriate for a particular implementation.

As shown in FIG. 4, logic gates 24 in the same bank are spread apart from one another by at least a distance W at the surface of integrated circuit 15. For example, logic gates $24_0$, $24_1$ are separated from one another by distance W, as are logic gates $24_6$, $24_7$; logic gates $24_2$, $24_3$; and logic gates $24_4$, $24_5$. Conversely, in the arrangement of FIG. 4, adjacent logic gates $24_0$, $24_7$ are from opposite banks, as are logic gates $24_1$, $24_6$; logic gates $24_2$, $24_5$; and logic gates $24_3$, $24_4$. In similar fashion, the two data paths of the input data state received on line $Q\_IN_k$ are separated from one another by distance W; in this example, logic gate 25 (and thus node N1) is physically separated from pass gate 21 (and thus node N0) by distance W.

Distance W can be selected from characterization, according to the cross-sectional circuit area affected by an SEU, such that two nodes separated by distance W cannot both be upset by the same SEU, at least to a desired statistical confidence level. For a manufacturing technology in which the minimum transistor feature size is 130 nm, an example of distance W would be on the order of 5 to 10 µm. In this embodiment of the invention, this separation ensures that an SEU disturbing two nodes that could change the state of latch $20_k$ is prevented. For example, if the outputs of both of logic gates $24_0$ and $24_1$ were disturbed from a "0" state to a "1" state, the outputs of all four logic gates $24_4$ through $24_7$ would change state, which would in turn cause the outputs of all four logic gates $24_0$ through $24_3$ to change state, latching the false data state into latch $20_k$. Conversely, logic gates $24_0$ and $24_7$ from opposite banks can be placed adjacent to one another by a distance less than distance W, because an SEU that simultaneously upsets the state of both logic gates $24_0$ and $24_7$ would not cause latch $20_k$ to latch a false data state. In addition, the adjacent placement of logic gates 24 from opposite banks can facilitate the routing of feedback conductors.

In addition, logic gates $24_0$, $24_7$, $24_2$, $24_5$ on one physical side of the separation by distance W are mirror images of logic gates $24_1$, $24_6$, $24_3$, $24_4$ on the opposite side. As shown in FIG. 4, p-wells $30p$ in which the n-channel transistors of logic gates 24 are realized are disposed "outboard" of n-wells $30n$ in which the p-channel transistors of logic gates 24 are realized. This mirror image arrangement is useful to minimize the length of conductors between pairs of logic gates 24 within a bank (e.g., between logic gates $24_0$ and $24_1$).

Those skilled in the art having reference to this specification can recognize variations to the layout illustrated in the example of FIG. 4. However, immunity is favored by the physical separation of pairs of nodes that, if disturbed by the same SEU, would cause latch $20_k$ to store a false data state.

Latch $20_k$ can be constructed according to alternative logic design approaches, as will be appreciated by those skilled in the art having reference to this specification. An example of such an alternative logic design will now be described with reference to latch $20'_k$ shown in FIG. 5, which is constructed in a similar manner as described above relative to latch $20_k$ shown in FIG. 2b, but with complementary ("negative") logic.

Figure 5:
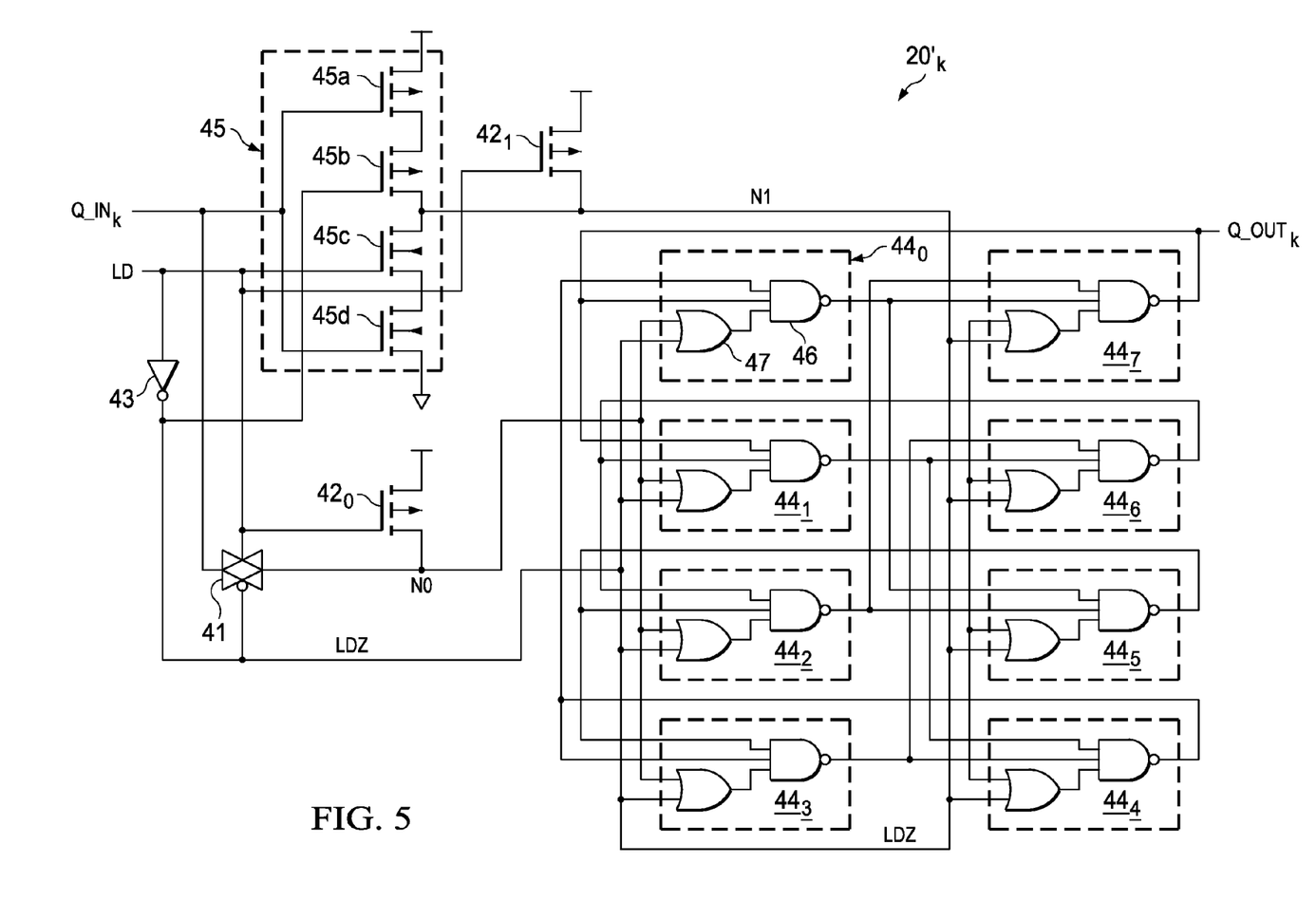
FIG. 5 is an electrical diagram, in schematic form, of the memory cell circuit constructed according to complementary logic relative to the circuit of FIG. 2b, according to an embodiment of the invention.

In the example of FIG. 5, as before, latch $20'_k$ provides redundant input data paths for the data state received on data input line $Q\_IN_k$. Pass gate 41 receives load enable signal LD and its complement LDZ (via inverter 43 in this case); when pass gate 41 is turned on by an active high level of signal LD, the state at data input line $Q\_IN_k$ is forwarded to node N0. The other redundant input data path is provided by logic gate 45, constructed similarly as logic gate 25 of FIG. 2b. As such, logic gate 45 drives node N1 with the logical complement of the state at data input line $Q\_IN_k$ in response to load enable signal LD at its active high level. In latch $20'_k$ as shown in FIG. 5, p-channel pull-up device $42_0$ has its source/drain path coupled between node N0 and the $V_{dd}$ power supply voltage, p-channel pull-up device $42_1$ has its source/drain path coupled between node N1 and $V_{dd}$, and both of devices $42_0$, $42_1$ receive signal LD at their gates. Pull-up devices $42_0$, $42_1$ then bias nodes N0, N1, respectively, to $V_{dd}$ when load enable signal LD is inactive low.

In latch $20'_k$, logic gates 44 are arranged in two banks in similar fashion as latch $20_k$ of FIG. 2b. In this example, each of logic gates $44_0$ through $44_3$ in a first bank includes two-input OR gate 47 with inputs receiving the logic level at node N0 and complementary load enable signal LDZ, and OR gate 47 in each of logic gates $44_4$ through $44_7$ of a second bank have inputs receiving the logic level at node N1 and complementary load enable signal LDZ. Each logic gate 44 also includes three-input NAND gate 46, where one input of NAND gate 46 receives the output of its two-input OR gate 47. The two remaining inputs to NAND gate 46 in each of the eight logic gates 44 of latch $20'_k$ receive outputs from others of logic gates 44, routed in an interlocking fashion as summarized by:

| Logic gate | One NAND input receives the output of: | Another NAND input receives the output of: | Its OR input receives data node: |
|---|---|---|---|
| $44_0$ | $44_7$ | $44_4$ | N0 |
| $44_1$ | $44_6$ | $44_7$ | N0 |
| $44_2$ | $44_5$ | $44_6$ | N0 |
| $44_3$ | $44_5$ | $44_4$ | N0 |
| $44_4$ | $44_1$ | $44_3$ | N1 |
| $44_5$ | $44_0$ | $44_2$ | N1 |
| $44_6$ | $44_3$ | $44_1$ | N1 |
| $44_7$ | $44_2$ | $44_0$ | N1 |

In general, the output of each logic gate 44 in one bank is presented to the inputs of a NAND gate 46 in two logic gates 44 in the other bank, and inputs to the NAND gate 46 in each logic gate 44 of a given bank receive outputs from two separate logic gates 44 in the other bank. As shown in FIG. 5, the output of logic gate $44_7$ drives output data line $Q\_OUT_k$, which may be buffered or otherwise forwarded via other logic or output drive functions as desired. Again, while logic gates 44 are described above and illustrated as two separate gates of NAND gate 46 and OR gate 47, those skilled in the art having reference to this specification will recognize that logic gates 44 may be realized as a single complex logic gate circuit implementing the combination of the NAND and OR logic functions.

The operation of latch $20'_k$ essentially corresponds to that described above for latch $20_k$ of FIG. 2b, differing of course in the logical combinations generated by logic gates 44, constructed by way of OR gate 47 and NAND gate 46. In addition, single node SEU immunity is provided by latch $20'_k$ in essentially the same manner as described above relative to latch $20_k$, by its construction including redundant input data paths to nodes N0, N1 and interlocking feedback among its logic gates 44. Those skilled in the art having reference to this specification will be able to follow the logical operation of latch $20'_k$ in the manner described above for latch $20_k$ so as to comprehend that operation and SEU immunity. To ensure that SEUs impact only a single node, to the extent practicable, it is desirable to physically layout integrated circuit 15 to realize latch $20'_k$ in a manner similar to that described above relative to FIG. 4.

Figure 6:
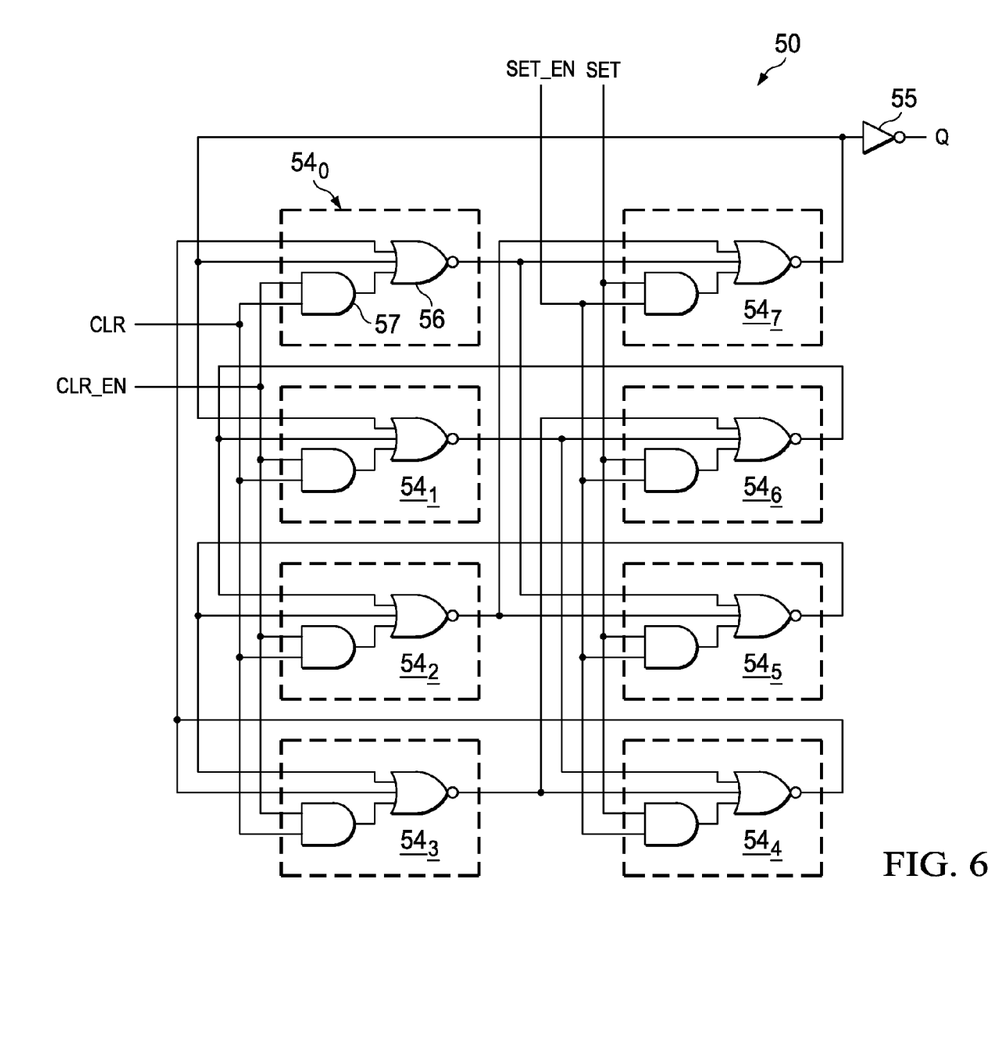
FIG. 6 is an electrical diagram, in schematic form, of a flip-flop circuit constructed according to another embodiment of the invention.

According to other embodiments of the invention, single event SEU immunity can be realized in other types of circuits that latch or store a digital data state. One such embodiment of the invention is illustrated in FIG. 6, in the form of R-S flip-flop 50; of course, flip-flop 50 may be instead realized in the form of a J-K flip-flop, D-type flip-flop, T-type flip-flop, etc., depending on the desired arrangement.

As in latches $20_k$ described above, flip-flop 50 includes eight logic gates 54, arranged in two banks with logic gates $54_0$ through $54_3$ constituting one bank and logic gates $54_4$ through $54_7$ constituting the other bank. Logic gate $54_7$ drives output line Q via inverter 55, in this example; of course, a complementary output may be driven directly from the output of logic gate $54_7$, or from the output of any of logic gates 54 with an inverter included as appropriate to drive the desired logic state.

In this example, logic gates 54 are constructed as the combination of three-input NOR gate 56 and two-input AND gate 57, where one input of NOR gate 56 receives the output of AND gate 57. As before, those skilled in the art having reference to this specification will recognize that logic gates 54 may be realized as a single complex logic gate circuit implementing the combination of the AND and NOR functions. Logic gates $54_0$, $54_1$, $54_2$, $54_3$ each receive clear line CLR and clear enable line CLR_EN at the inputs to its AND gates 57; conversely, the inputs of AND gate 57 in each of logic gates $54_4$, $54_5$, $54_6$, $54_7$ receive set line SET and set enable line SET_EN at the inputs of their AND gates 27. As evident from this arrangement, an active high level on enable lines CLR_EN and SET_EN is required for the state of lines CLR and SET, respectively, to define the output of the corresponding AND gates 57. It is contemplated that logic circuitry outside of flip-flop 50 will be constructed and operated to ensure that enable lines CLR_EN, SET_EN are not simultaneously at an active high level, in order to avoid data contention within flip-flop 50.

The output of each logic gate 54 is coupled to inputs of NOR gates 56 in selected ones of other logic gates 54, in similar manner as described above in connection with FIG. 2b. More specifically, according to this embodiment of the invention, the two inputs to NOR gate 56, other than the input driven by its corresponding AND gate 57, in a given logic gate 54 in one of the banks receive outputs from logic gates 54 in the opposite bank. For example, one input of NOR gate 56 in logic gate $54_0$ receives the output of logic gate $54_4$, and a second input of that NOR gate 56 receives the output of logic gate $54_7$; both of logic gates $54_4$ and $54_7$ are in the opposite bank from logic gate $54_0$. In general, the output of each logic gate 54 in one bank is presented to inputs of two logic gates 54 in the other bank, and inputs of each logic gate 54 in a given bank receive outputs from two separate logic gates 54 in the other bank. The interlocking feedback arrangement of logic gates 54 in flip-flop 50 according to this invention is summarized in the table:

| Logic gate | One NOR input receives the output of: | Another NOR input receives the output of: | Its AND input receives signal: |
|---|---|---|---|
| $54_0$ | $54_7$ | $54_4$ | CLR |
| $54_1$ | $54_6$ | $54_7$ | CLR |
| $54_2$ | $54_5$ | $54_6$ | CLR |
| $54_3$ | $54_5$ | $54_4$ | CLR |
| $54_4$ | $54_1$ | $54_3$ | SET |
| $54_5$ | $54_0$ | $54_2$ | SET |
| $54_6$ | $54_3$ | $54_1$ | SET |
| $54_7$ | $54_2$ | $54_0$ | SET |

The operation flip-flop 50 according to this embodiment of the invention will be described beginning from an initially "set" state (Q="1"), with set enable line SET_EN and clear enable line CLR_EN both inactive low. In this set state, the outputs of logic gates $54_4$ through $54_7$ are all at a "0" level, resulting in output line Q at a "1" level via inverter 55. The feedback of the "0" levels at logic gates $54_4$ through $54_7$ to the inputs of logic gates $54_0$ through $54_3$, in combination with set enable line SET_EN and clear enable line CLR_EN both inactive low (the outputs of AND gates 57 in those logic gates 54 forced to "0"), cause the outputs of logic gates $54_0$ through $54_3$ to be at a "1" level. In this condition, flip-flop 50 is in its set state.

To clear the state of flip-flop 50, clear line CLR is driven to an active high level while clear enable line CLR_EN is also driven active high. In response, AND gates 57 in each of logic gates $54_0$ through $54_3$ drive their outputs to a "1" level, causing the outputs of logic gates $54_0$ through $54_3$ to make a transition to a "0" level. The "0" levels at the outputs of logic gates $54_0$ through $54_3$ propagate through logic gates $54_4$ through $54_7$ (the outputs of their AND gates 57 remaining low because set enable line SET_EN is inactive low), resulting in "1" levels at the output of those logic gates $54_4$ through $54_7$. These "1" levels, applied to the inputs of NOR gates 56 in logic gates $54_0$ through $54_3$, ensure that the outputs of logic gates $54_0$ through $54_3$ remain at "0" levels upon clear enable line CLR_EN returning inactive low, thus latching the clear state into flip-flop 50. The "1" level now at the output of logic gate $54_7$ appears on line Q as a "0" level, through the action of inverter 55, representing the clear state of flip-flop 50.

The opposite operation occurs in setting flip-flop 50. From the clear state, upon set line SET driven active high while set enable line SET_EN is active high, AND gates 57 in each of logic gates $54_4$ through $54_7$ drive their outputs to a "1" level, forcing the outputs of those logic gates $54_4$ through $54_7$ to a "0" level. These "0" levels are applied to inputs of NOR gates 56 in logic gates $54_0$ through $54_3$ (the outputs of their AND gates 57 remaining low because clear enable line CLR_EN is inactive low), causing the outputs of logic gates $54_0$ through $54_3$ to transition to a "1" level. Those "1" levels, applied to the inputs of NOR gates 56 in logic gates $54_4$ through $54_7$, latch the set state into flip-flop 50, by holding the outputs of logic gates $54_0$ through $54_3$ at a "0" level upon set enable line SET_EN returning inactive low. The "0" level at the output of logic gate $54_7$ appears on line Q as a "1" level, indicating the set state of flip-flop 50.

Those skilled in the art having reference to this specification will recognize that flip-flop 50 also provides single node SEU immunity in essentially the same manner as described above in connection with other embodiments of this invention. To summarize, the interlocking feedback among logic gates 54 in flip-flop 50 ensure that an SEU disturbance sufficient to cause a logic transition at any single node cannot operate to change the latched state of flip-flop. In addition, to ensure that SEUs impact only a single node within flip-flop 50 to the extent practicable, the layout considerations described above in connection with FIG. 4 should be followed.

Of course, alternative realizations of flip-flop 50 can also be realized according to this embodiment of the invention. For example, a complementary (or "negative") logic realization of logic gates 56 can alternatively be used, similar to that shown for latch 20'$_k$ of FIG. 5 described above. And, as mentioned above, those skilled in the art will be readily able to adapt flip-flop 50 according to this embodiment of the invention to realize other types of flip-flops and latches (e.g., flip-flop types J-K, D, T, etc.). Such alternative realizations are also contemplated to be within the scope of this invention as claimed.

In addition, it is contemplated that the single-node SEU immune latches according to this invention can be used in a wide range of sensitive applications, well beyond the SRAM register application described above relative to FIG. 1, and beyond use of this invention in combination with embedded or stand-alone FeRAM memories. For example, it is contemplated that flip-flops, latches, and register contents within sensitive programmable, custom, or semi-custom logic circuits can be constructed in this manner. It is also contemplated that the applications in which such SEU immunity are important include not only medical devices, but also systems and devices deployed in a wide range of applications, particularly those in which replacement or resetting of the integrated circuits is costly or impractical, including space-deployed systems, systems and devices in offshore or remote locations, and the like.

While the present invention has been described according to various embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A latch circuit, comprising:
    a first bank of logic gates, each logic gate in the first bank of logic gates having an input coupled to a first input node, having two feedback inputs, having an input coupled to a load enable signal, and having an output; and
    a second bank of logic gates, each logic gate in the second bank of logic gates having an input coupled to a second input node, having two feedback inputs, having an input coupled to the load enable signal, and having an output;
    wherein the two feedback inputs of each logic gate in the first bank of logic gates are connected to outputs of two separate logic gates in the second bank of logic gates;
    wherein the two feedback inputs of each logic gate in the second bank of logic gates are connected to outputs of two separate logic gates in the first bank of logic gates;
    wherein the output of each logic gate in the first bank of logic gates is connected to a feedback input of each of two logic gates of the second bank of logic gates;
    wherein the output of each logic gate in the second bank of logic gates is connected to a feedback input of each of two logic gates of the first bank of logic gates;
    and wherein the latch circuit has an output at the output of one of the logic gates in one of the first and second banks of logic gates.

2. The latch circuit of claim 1, wherein the first bank of logic gates comprises four logic gates; and wherein the second bank of logic gates comprises four logic gates.

3. The latch circuit of claim 2, wherein the output of the first logic gate in the first bank of logic gates is connected to feedback inputs of first and third logic gates in the second bank of logic gates;
    wherein the output of the second logic gate in the first bank of logic gates is connected to feedback inputs of second and fourth logic gates in the second bank of logic gates;
    wherein the output of the third logic gate in the first bank of logic gates is connected to feedback inputs of the first and the third logic gates in the second bank of logic gates;
    wherein the output of the fourth logic gate in the first bank of logic gates is connected to feedback inputs of the second and the fourth logic gates in the second bank of logic gates;
    wherein the output of the first logic gate in the second bank of logic gates is connected to feedback inputs of the first and the second logic gates in the first bank of logic gates;
    wherein the output of the second logic gate in the second bank of logic gates is connected to feedback inputs of the second and the third logic gates in the first bank of logic gates;
    wherein the output of the third logic gate in the second bank of logic gates is connected to feedback inputs of the third and the fourth logic gates in the first bank of logic gates;
    and wherein the output of the fourth logic gate in the second bank of logic gates is connected to feedback inputs of the first and the fourth logic gates in the first bank of logic gates.

4. The latch circuit of claim 1, wherein each of the logic gates in each of the first and second banks of logic gates comprises:
    a NOR gate having at least three inputs, two of the inputs to the NOR gate comprising the feedback inputs of the logic gate.

5. The latch circuit of claim 4, wherein each of the logic gates in each of the first and second banks of logic gates further comprises:
    an AND gate having an output coupled to a third input of the NOR gate of the logic gate, and having two inputs.

6. The latch circuit of claim 5, wherein a first input of the AND gate in each of the logic gates of the first bank of logic gates is connected to the first input node;
    wherein a first input of the AND gate in each of the logic gates of the second bank of logic gates is connected to the second input node;
    and wherein the second input of the AND gate in each of the logic gates is connected to an enable line.

7. The latch circuit of claim 6, wherein the second input of the AND gate in each of the logic gates of the first bank of logic gates is connected to a first enable line associated with the first input node;
    and wherein the second input of the AND gate in each of the logic gates of the second bank of logic gates is connected to a second enable line associated with the second input node.

8. The latch circuit of claim 1, wherein each of the logic gates in each of the first and second banks of logic gates comprises:
    a NAND gate having at least three inputs, two of the inputs to the NAND gate comprising the feedback inputs of the logic gate.

9. The latch circuit of claim 8, wherein each of the logic gates in each of the first and second banks of logic gates further comprises:
an OR gate having an output coupled to a third input of the NAND gate of the logic gate, and having two inputs.

10. The latch circuit of claim 9, wherein a first input of the OR gate in each of the logic gates of the first bank of logic gates is connected to the first input node;
wherein a first input of the OR gate in each of the logic gates of the second bank of logic gates is connected to the second input node;
and wherein the second input of the OR gate in each of the logic gates is connected to an enable line.

11. The latch circuit of claim 9, wherein the second input of the OR gate in each of the logic gates of the first bank of logic gates is connected to a first enable line associated with the first input node;
and wherein the second input of the OR gate in each of the logic gates of the second bank of logic gates is connected to a second enable line associated with the second input node.

12. The latch circuit of claim 1, further comprising:
a first data path connected between a latch input and the first input node; and
a second data path connected between the latch input and the second input node.

13. The latch circuit of claim 12, wherein each of the logic gates comprises an inverting function relative to its feedback inputs, so that the outputs of the logic gates of the first bank of logic gates each presents a data state that is the logical complement of the data state presented at the output of each of the logic gates of the second bank of logic gates.

14. The latch circuit of claim 13, wherein the first and second data paths present complementary data states relative to one another at the first and second input nodes.

15. A latch circuit formed at a surface of a semiconducting body, comprising:
a first bank of logic gates, each logic gate in the first bank of logic gates having an input coupled to a first input node, having two feedback inputs, having an input coupled to a load enable signal, and having an output; and
a second bank of logic gates, each logic gate in the second bank of logic gates having an input coupled to a second input node, having two feedback inputs, having an input coupled to the load enable signal, and having an output;
wherein the two feedback inputs of each logic gate in the first bank of logic gates are connected to outputs of two separate logic gates in the second bank of logic gates;
wherein the two feedback inputs of each logic gate in the second bank of logic gates are connected to outputs of two separate logic gates in the first bank of logic gates;
wherein the output of each logic gate in the first bank of logic gates is connected to a feedback input of each of two logic gates of the second bank of logic gates;
wherein the output of each logic gate in the second bank of logic gates is connected to a feedback input of each of two logic gates of the first bank of logic gates;
wherein the latch circuit has an output at the output of one of the logic gates in one of the first and second banks of logic gates;
wherein each logic gate of the first bank of logic gates is disposed at a location of the surface that is at least a selected distance away from any other logic gate in the first bank of logic gates, with a logic gate of the second bank of logic gates within the selected distance from the logic gate of the first bank of logic gates;
and wherein each logic gate of the second bank of logic gates is disposed at a location of the surface that is at least a selected distance away from any other logic gate in the second bank of logic gates, with a logic gate of the first bank of logic gates within the selected distance from the logic gate of the second bank of logic gates.

16. The latch circuit of claim 15, further comprising:
a first data path connected between a latch input and the first input node; and
a second data path connected between the latch input and the second input node;
wherein the first and second data paths are disposed at locations of the surface that are at least a selected distance away from one another.

17. The latch circuit of claim 16 wherein the selected distance is about 5 to 10 μm.

18. A latch circuit, comprising:
a first bank of logic gates, each logic gate in the first bank of logic gates having an input coupled to a first input node, having two feedback inputs, having an input coupled to a load enable signal, and having an output; and
a second bank of logic gates, each logic gate in the second bank of logic gates having an input coupled to a second input node, having two feedback inputs, having an input coupled to the load enable signal, and having an output;
wherein each of the logic gates comprises an inverting function relative to its feedback inputs, so that the outputs of the logic gates of the first bank of logic gates each present a data state that is the logical complement of the data state presented at the output of each of the logic gates of the second bank of logic gates, to define a stored state of the latch circuit;
and wherein the feedback inputs of each logic gate in the first bank of logic gates are connected to outputs of logic gates in the second bank of logic gates, and the feedback inputs of each logic gate in the second bank of logic gates are connected to outputs of logic gates in the first bank of logic gates, in such a manner that a change of state at the output of any one of the logic gates will not cause the latch circuit to change its stored state.

19. The latch circuit of claim 18, further comprising:
a first data path connected between a latch input and the first input node; and
a second data path connected between the latch input and the second input node;
wherein the feedback inputs of each logic gate are connected to outputs of logic gates in such a manner that a change of state at the output of a single one of the first and second input nodes will not cause the latch circuit to change its stored state.

20. The latch circuit of claim 19, wherein each of the logic gates comprises first and second logic functions, the first logic function having two inputs corresponding to the two feedback inputs and a third input coupled to an output of the second logic function;
wherein the second logic function in each logic gate of the first bank of logic gates has a first input coupled to the first input node and a second input coupled to an enable input;
and wherein the second logic function in each logic gate of the second bank of logic gates has a first input coupled to the second input node and a second input coupled to an enable input.

21. The latch circuit of claim 20, wherein the second input of the second logic function of each logic gate in both the first and second banks of logic gates are coupled together to a load input of the latch circuit.

22. The latch circuit of claim 20, wherein the second input of the second logic function of each logic gate in the first bank of logic gates are coupled to a first enable input associated with the first input node;

and wherein the second input of the second logic function of each logic gate in the second bank of logic gates are coupled to a second enable input associated with the second input node.

23. The latch circuit of claim 20, wherein each logic gate is constructed of a single complex logic gate circuit implementing the first and second logic functions.

* * * * *